United States Patent [19]
Fujii

[11] Patent Number: 5,349,309
[45] Date of Patent: Sep. 20, 1994

[54] SECOND ORDER PHASE LOCKED LOOP
[75] Inventor: Takashi Fujii, Tokyo, Japan
[73] Assignee: NEC Corporation, Tokyo, Japan
[21] Appl. No.: 41,317
[22] Filed: Mar. 31, 1993
[30] Foreign Application Priority Data
  Mar. 31, 1992 [JP] Japan .................................. 4-077880
[51] Int. Cl.$^5$ .......................................... H03L 7/089
[52] U.S. Cl. .................... 331/17; 331/1 A; 375/120
[58] Field of Search ............... 331/1 A, 17, 18, 25; 375/120

[56] References Cited
U.S. PATENT DOCUMENTS
5,057,794 10/1991 Shih .................................. 331/17 X

OTHER PUBLICATIONS
F. Gardner, "Charge-Pump Phase-Lock Loops", IEEE Transactions on Communications, vol. COM-28, No. 11, Nov. 1980, pp. 1849-1858.
C. Shih et al, "Jitter Attenuation Phase Locked Loop Using Switched Capacitor Controlled Crystal Oscillator", IEEE 1988 Custom Integrated Circuits Conference, pp. 9.5.1-9.5.3.
Electronics and Communications in Japan, vol. 70, No. 7, Jul. 1987, pp. 70-76, Hiroomi Hikawa et al, "Al Digital Phase-Locked Loop With a Wide Locking Range".
IBM Technical Disclosure Bulletin, vol. 31, No. 7, Dec. 1988, pp. 455-458, "Feed-Forward Compensation Circuit for Digital Random-Walk Filters".
Transactions of the Institute of Electronics, Information and Comm. Engineers of Japan, vol. E72, No. 2, Feb. 1989, pp. 111-117, Hiroomi Hikawa et al., "A Digital Phase-Locked Loop With a Low Frequency Clock".

Primary Examiner—David Mis
Attorney, Agent, or Firm—Sughrue, Mion, Zinn, Macpeak & Seas

[57] ABSTRACT

A phase locked loop using an oscillating circuit for controlling the frequency by a digital signal according to the present invention comprises a loop filter. The loop filter includes a random walk filter 3, a counter 4, a register 5 and an adder 6. The oscillating circuit 7 emits a signal having a frequency corresponding to the output of the adder 6. Further, a phase/frequency detector 2 emits a phase lag signal LAG and a phase lead signal LEAD according to the phase difference between a signal IN provided to an input terminal 1 and a signal REF provided from the oscillating circuit 7 to thereby increase the degree of freedom for determining a loop constant while avoiding generation of the steady phase error relative to the frequency offset.

4 Claims, 6 Drawing Sheets

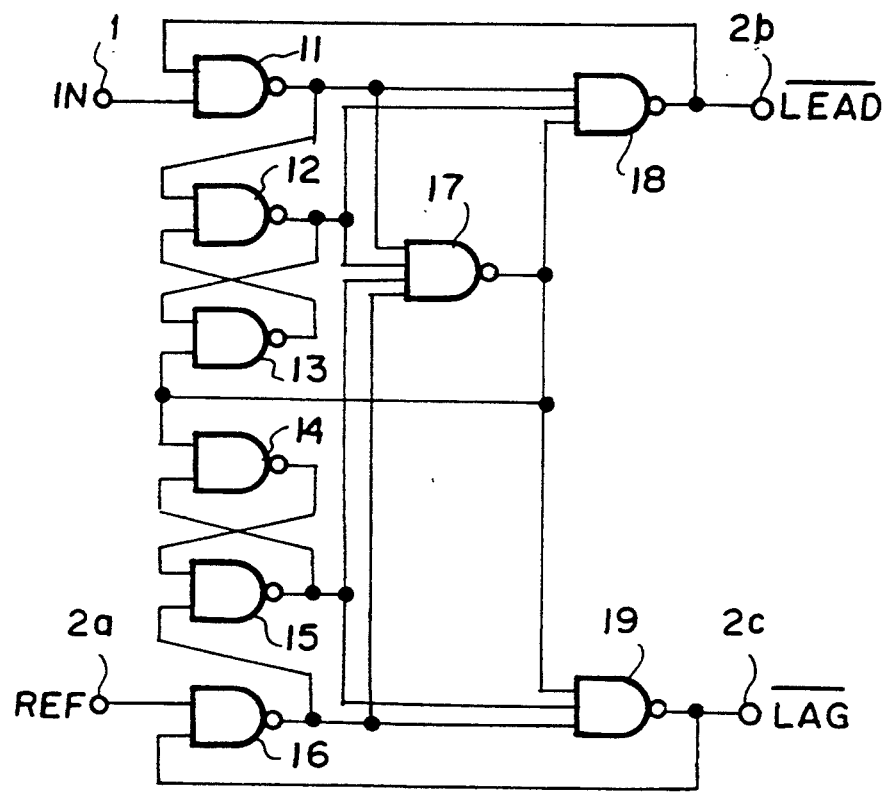
F I G. 3

SECOND ORDER PHASE LOCKED LOOP

FIELD OF THE INVENTION

The present invention relates to a phase locked loop and, in particular, to a phase locked loop comprising an oscillator circuit in which the oscillating frequency is controlled according to digital signal.

BACKGROUND OF THE INVENTION

A phase locked loop has widely been used in the applications such as frequency control, frequency synthesis, FM demodulation, data recovery, signal synchronization or the like.

Further, in one of the application phase locked loop, there is a jitter attenuator which may remove the phase fluctuation, i.e. jitter, caused by superimposed clocks. In this case, it is necessary that the loop bandwidth of the phase locked loop used in the jitter attenuator is narrow as compared with the frequency bandwidth of the jitter to be eliminated. In order to narrow the loop bandwidth, it is most effective to lower the gain of a voltage control oscillating circuit which constitutes the phase locked loop. The voltage control oscillating circuit which lower the gain of phase locked loop can readily be realized if a quartz oscillating circuit constituting the phase locked loop is used.

FIG. 1 is a block diagram illustrating the arrangement of a conventional jitter attenuator phase locked loop using the quartz oscillating circuit (See "JITTER ATTENUATION PHASE LOCKED LOOP USING SWITCHED CAPACITOR CONTROLLED CRYSTAL OSCILLATOR", IEEE 1988 CUSTOM INTEGRATED CIRCUITS CONFERENCE).

This phase locked loop is comprised of a phase/frequency detector 92, a flip-flop circuit 93 and a quartz oscillating circuit. Further, the foregoing quartz oscillating circuit is comprised of a quartz-crystal resonator 94, an amplifier circuit 95, load capacitors 100 through 105 and switches 96 through 99 for switching load capacitors 100, 101, 104, 105 respectively. Incidentally, the capacitance of each of the load capacitors 102, 103 is C1, the capacitance of each of the load capacitors 100, 105 is C2 and the capacitance of each of the load capacitors 101, 104 is C3.

The phase/frequency detector 92 compares the phases of a signal IN provided to an input terminal 91 and of an signal REF provided from the quartz oscillating circuit. If the phase of the IN signal is more advanced than that of the REF signal, then it emits a signal LEAD according to that phase difference and, if the phase of the IN signal is more lagged than that of the REF signal, it emits a signal LAG according to that phase difference. The flip-flop circuit 93 operates in synchronism with a clock signal CLOCK and emits a signal UP or DOWN according to the output of the phase/frequency detector 92.

At the quartz oscillating circuit, if the signal UP is provided, then switches 96 through 99 are all turned OFF, and only the load capacitors 102, 103 are electrically connected to both terminals of the quartz-crystal resonator 94. Further, if the signal DOWN is provided, the switches 96 through 99 are all turned ON, and the load capacitors 100 through 105 are electrically connected to both terminals of the quartz-crystal resonator 94. Further, if any one of the signals UP and DOWN is not entered, then the switches 96, 99 are turned ON, and the switches 97, 98 are turned OFF, and the load capacitors 100, 102, 103, 105 are electrically connected to both terminals of the quartz-crystal resonator 94. Since the oscillating frequency of the quartz oscillating circuit depends on the capacitance of the load capacitor connected to the quartz-crystal resonator and is decreased as the capacitance is increased, the oscillating frequency of the quartz oscillating circuit is switched depending on the signals UP and DOWN given from the flip-flop circuit 93. Therefore, if the output of this quartz oscillating circuit is fed back to the phase/frequency detector 92, then a phase locked loop can be formed.

Incidentally, the phase locked loop of FIG. 1 is comprised of the phase/ferquency detector 92, flip-flop circuit 93 and oscillating circuit only, and has no portion corresponding to a loop filter. That is, with this phase locked loop, the order of the loop is one. With such a first order phase locked loop, it is known that the bandwidth of the loop is determined by only the loop gain. In consequence, in the circuit of FIG. 1, the bandwidth of the loop will be determined by only the gain of the quartz oscillating circuit.

However, the foregoing conventional phase locked suffers the following problems.

That is, since the gain of the quartz oscillating circuit is determined by the equivalent circuit of the quartz-crystal resonator and the load capacitance, its resulting gain suffers a certain limit of itself, and a desired loop bandwidth often cannot be obtained. In other words, with the conventional phase locked loop, because of the first order loop, the degree of freedom is small when the loop bandwidth is determined.

Further, with the first order phase locked loop, when a difference arises between the input signal frequency and the central frequency of the oscillating circuit, a steady phase error can be generated in proportion to the frequency offset. With the jitter attenuator, it is necessary to use a FIFO (First-in, First-out) which writes in synchronism with the input of the phase locked loop while reading in synchronism with the output. However, if the steady phase error takes place to the phase locked loop, then it becomes necessary to use the additional FIFO stage corresponding to the phase error. Therefore, it is necessary to predict how far the frequency error will occur so that the FIFO having the additional stage number corresponding to that frequency error may be available.

The present invention was conceived in view of the foregoing circumstances, and its object is to provide a phase locked loop in which the freedom of choice of the loop bandwidth is large and which may prevent the steady phase error relative to the frequency offset from being generated.

SUMMARY OF THE INVENTION

A phase locked loop according to the present invention comprises a voltage control oscillating circuit; a phase/frequency detector for comparing the phases of the input signal and of the output of the voltage control oscillating circuit; a random walk filter for selectively emitting an up pulse and a down pulse according to the output of the phase/frequency detector; and a counter for accumulating the up pulse and the down pulse; a register for emitting a specific value according to the output of the phase/frequency detector; and an adder for adding the output of the counter and the output of the register, the voltage control oscillating circuit emitting a signal having a frequency corresponding to the output of the adder.

The phase locked loop according to present invention comprises a random walk filter for selectively emitting an up pulse and a down pulse according to the output of the phase/frequency detector; a counter for accumulating the up pulse and the down pulse which are emitted from the random walk filter; a register for emitting a specific value according to the output of the phase/frequency detector; and an adder for adding the outputs of the counter and the register, all these components constituting a loop filter. In addition, the voltage control oscillating circuit emits a signal having a frequency corresponding to the output of the adder.

That is, since the phase locked loop according to the present invention is the secondary phase locked loop comprising a loop filter, the loop characteristic is determined by the natural frequency $\omega_n$ and the damping factor $\xi$ for the phase locked loop. These natural frequency $\omega_n$ and damping factor $\xi$ are each determined by the gain $K_c$ of the voltage control circuit, arrangement of the random walk filter, value emitted from the register and the like, and are great in degree of freedom as compared with the conventional first order phase locked loop, so that a desired loop bandwidth can be obtained.

Further, since the second order phase locked loop eliminates the generation of the steady phase error caused by the frequency offset, if the phase locked loop according to the present invention is used for the jitter attenuator, then the stage number of the FIFO can be reduced as compared with the prior art.

BRIEF DESCRIPTION OF THE DRAWINGS

FIG. 3 is a circuit diagram of a phase/frequency detector of the same;

DESCRIPTION OF THE PREFERRED EMBODIMENTS OF THE INVENTION

Some specific embodiments according to the present invention are hereinafter described with reference to the accompanying drawings.

Figure 2:
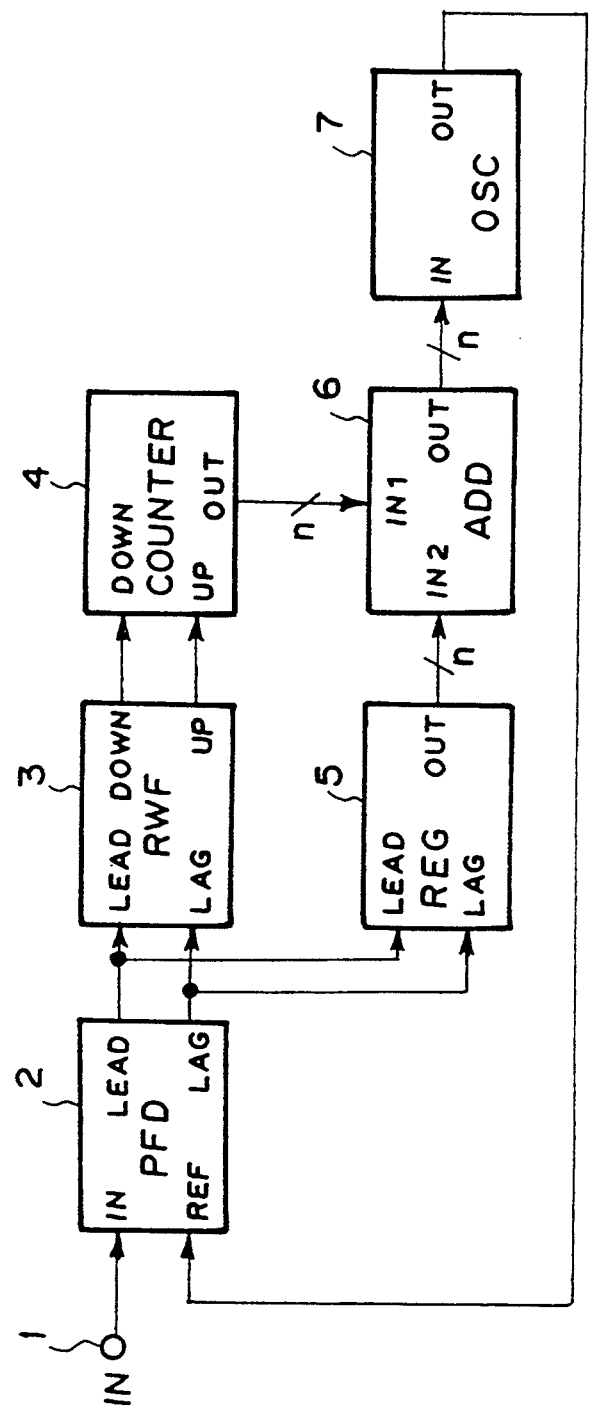
FIG. 2 is a block diagram of a phase locked loop according to a specific embodiment of the present invention.

FIG. 2 is a block diagram of a phase lock loop according to a specific embodiment of the present invention. The phase locked loop according to the present invention comprises an oscillating circuit 7 whose oscillating frequency is controlled by an n-bit digital signal; a phase/frequency detector 2 for comparing the output (REF) of the oscillating circuit 7 and a signal IN given to an input terminal 1 to emit a signal LEAD or LAG according to that phase difference; a random walk filter 3 for emitting an up pulse (hereinafter referred to as UP) or a down pulse (hereinafter referred to as DOWN) according to the output of the phase/frequency detector 2; a counter 4 for accumulating the UP or Down emitted from the random walk filter 3 to emit the result as an n-bit signal; a register 5 for emitting an n-bit signal according to the output of the phase/frequency detector 2; and an adder 6 for adding the outputs of the counter 4 and the register 5 to emit the result to the oscillating circuit 7. The random walk filter 3, counter 4, register 5 and adder 6 constitute a loop filter.

The phase/frequency detector 2, as illustrated in FIG. 3, is a common one comprising NAND gates 11 through 19. This phase/frequency detector 2, if the phase of the signal IN, which is provided to the input terminal 1, is lagged relative to the signal (REF) given from the oscillating circuit 7 via the input terminal 2a, emits a phase lagged signal LAG during a period of time corresponding to the phase difference, to the output terminal 2c and, if the phase of the IN is advanced relative to the REF, emits a leading signal LEAD during a period of time corresponding to the phase difference, to the output terminal 2b.

Figure 4:
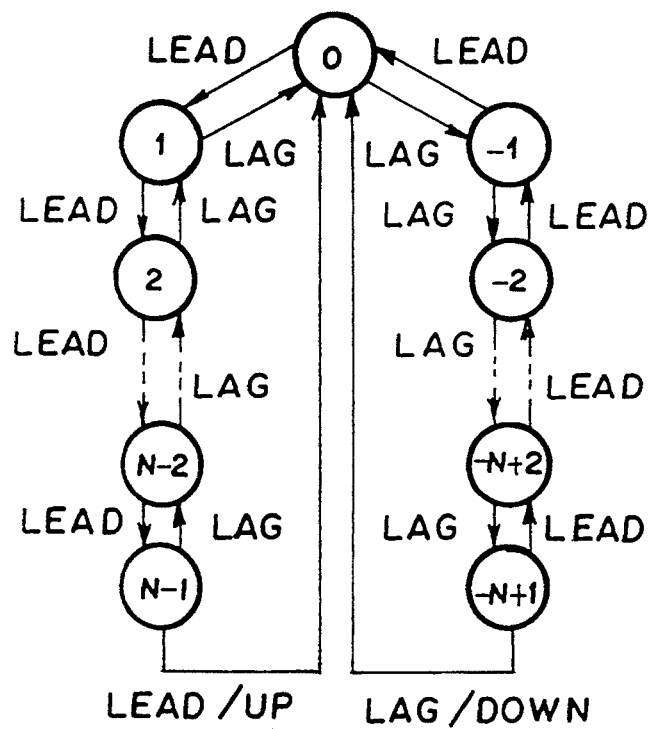
FIG. 4 is a state transition diagram illustrating the operation of a random walk filter of the same.

FIG. 4 is a state transition diagram illustrating the operation of the random walk filter 3, in which the circle represents a state, and the numeral therein represents a count value of the internal up-down counter.

The random walk filter 3 reads the output of the phase/frequency detector 2 at a predetermined clock cycle. If the input at that time is LEAD, then the internal up-down counter operates by $+1$, if LAG, then by $-1$ and if neither of them, then by 0 respectively. Further, if the count value of the up-down counter adds up to $+N$, then the UP is emitted to return to the initial value (0). On the other hand, if the count value of the up-down counter becomes $-N$, then the DOWN is emitted to return to the initial value.

Figure 5:
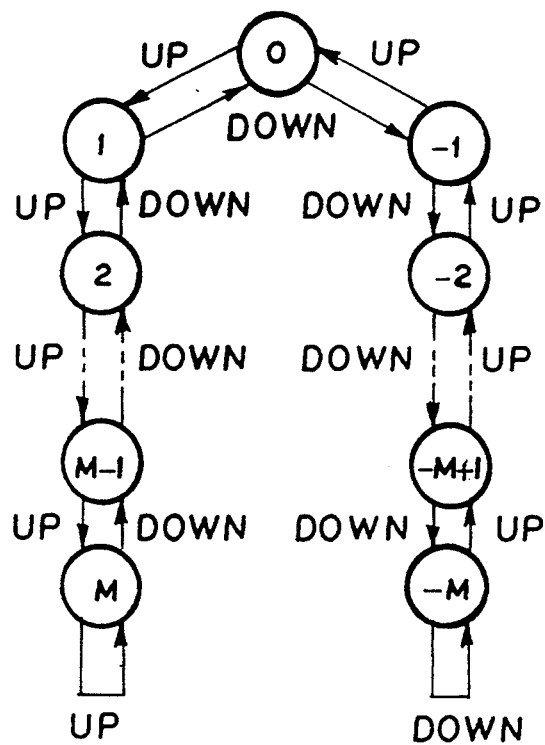
FIG. 5 is a state transition diagram illustrating the operation of a counter of the same.

FIG. 5 is a state transition diagram illustrating the operation of the counter 4, in which the circle also represents a state and the numeral therein represents the count value of the up-down counter.

This counter 4, if the UP is entered from the random walk filter 3, the internal up-down counter operates by $+1$, if the DOWN is entered, then by $-1$. That is, the UP and DOWN are sequentially calculated to accumulate the result. However, if the count value becomes $+M$, even if the UP is further entered, the count value is not changed. Further, if the count value becomes $-M$, even if the DOWN is further entered, the count value is not changed any more. The counter 4 emits this count value to the adder 6 as the n-bit signal.

On the other hand, while the LAG is being entered from the phase/frequency detector 2, then the register 9 emits $-G$ to the adder 6, while the LEAD is being entered therefrom, then it emits $+G$ and, during other period of time, it emits 0, as the n-bit signal.

The adder 6 adds the output of the counter 4 and the output of the register 5 to emit the result to the oscillating circuit 7.

Figure 6:
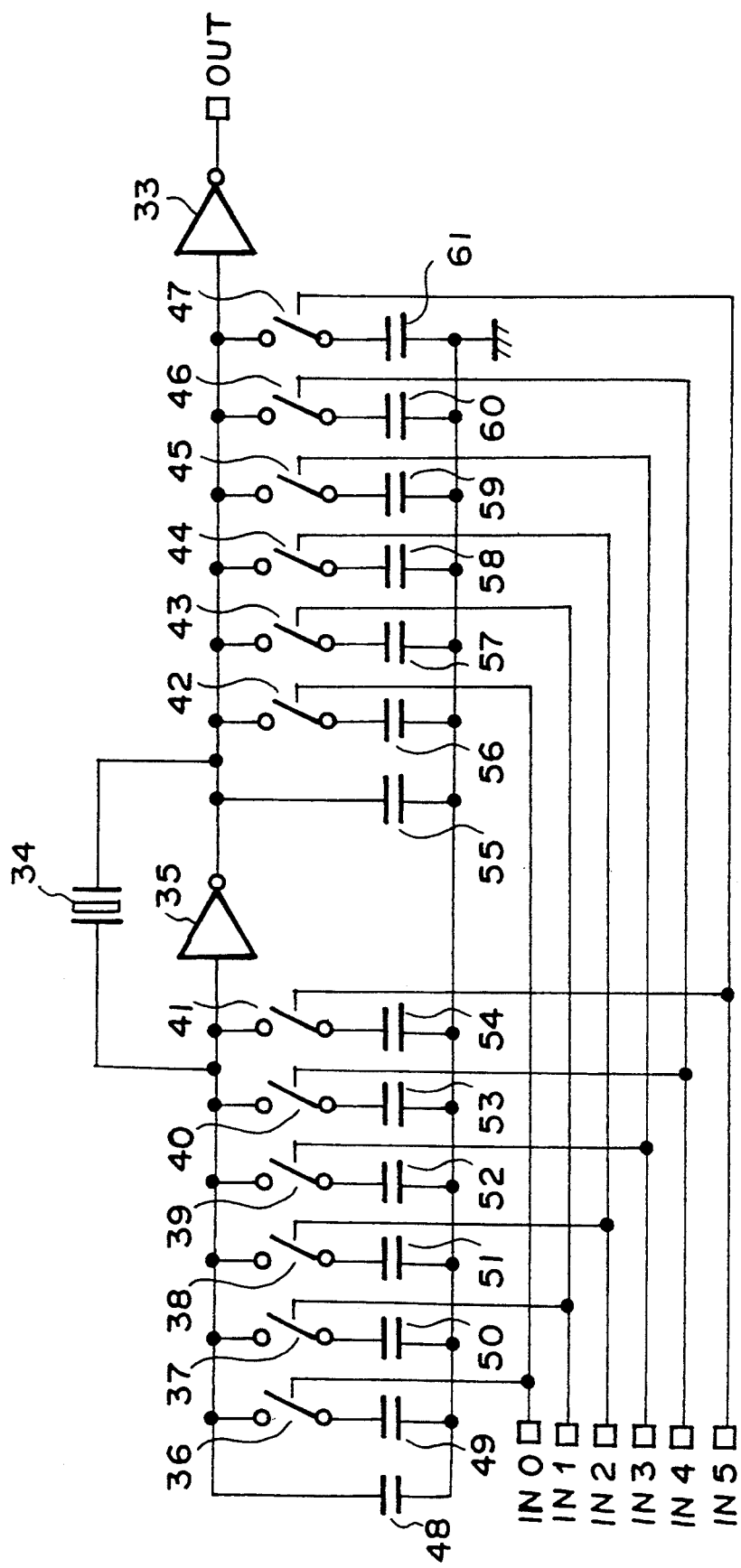
FIG. 6 is a circuit diagram illustrating a specific embodiment of an oscillating circuit of the same.

FIG. 6 is a circuit diagram illustrating a specific embodiment of the oscillating circuit of the quartz oscillating circuit.

This quartz oscillating circuit comprises a quartz-crystal resonator 34, an amplifier 35 whose input and output terminals are connected to both terminals of the quartz oscillator 34; load capacitors 48 through 61; switches 36 through 47 for connecting the load capacitors 49 through 54, 56 through 61 selectively to the quartz-crystal resonator 34 according to the 6-bit signals IN0 through IN5; and an amplifier 33 for transmitting the output of the amplifier 35 to the phase/frequency detector 2. Incidentally, the capacitance of the load capacitors 48, 49, 55, 56 is set to C, the capacitance for the load capacitors 50, 57 is 2C, the capacitance for the load capacitors 51, 58 is 4C, the capacitance for the load capacitors 52, 59 is 8C, the capacitance for the load capacitors 53, 60 16C and the capacitance for the load capacitors 54, 61 is 32C. This quartz oscillating circuit comprises a capacitor array of 6-bits as load capacitors which selectively opens and closes the switches 36 through 47 according to the 6-bit signals IN0 through IN5 to selectively connect these load capacitors to the quartz-crystal resonator to control the oscillating frequency of the quartz oscillating circuit.

Next, the operation of such a phase locked loop is hereinafter described. Since it is easy to understand when described with reference to the operation of the second order charge pump phase locked loop, the latter is first described.

Figure 7:
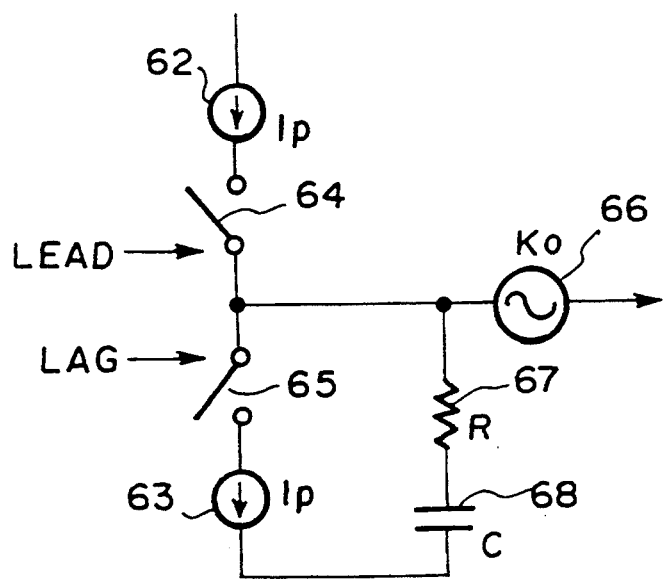
FIG. 7 is a block diagram illustrating a second order charge pump phase locked loop.

FIG. 7 is a block diagram illustrating the second order charge pump phase locked loop (See "CHARGE-PUMP PHASE-LOCKED LOOPS", IEEE TRANSACTIONS ON COMMUNICATIONS, VOL. COM-28, NO. 11, NOV. 1980). This charge pump phase locked loop comprises current sources 62, 63 each Ip in current, a switch 64 turned OFF by LEAD, a switch 65 turned OFF by LAG, a voltage control oscillating circuit 66 having a gain of $K_o$, a resistor 67 having a resistance of R and a capacitor 68 having a capacitance of C.

The natural frequency $\omega_n$ and the damping factor $\xi$ are each represented by the following formulae (1) and (2) respectively.

$$\omega_n = \{(K_o I_p)/(2\pi C)\}^{\frac{1}{2}} \quad (1)$$

$$\xi = (RC/2)\omega_n \quad (2)$$

Figure 8:
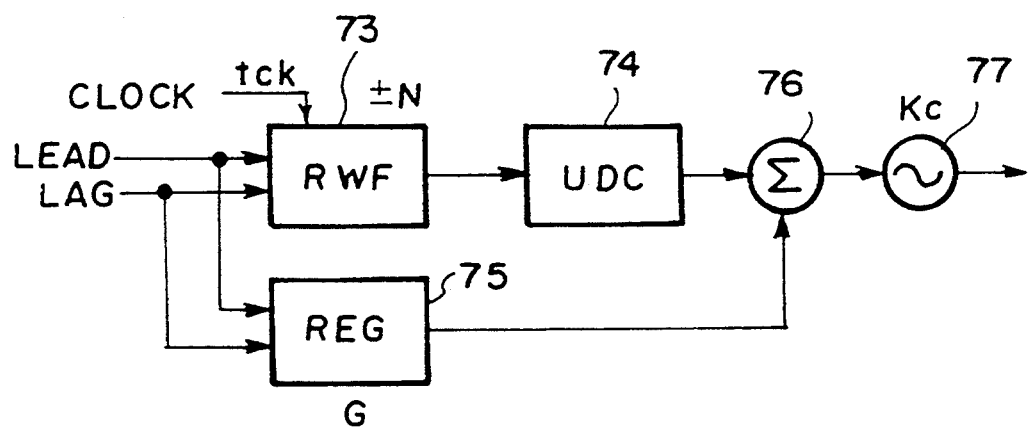
FIG. 8 is a block diagram of a loop filter and an oscillating circuit portion of the phase locked loop according to the embodiment of the present invention.

FIG. 8 is a block diagram illustrating a loop filter and an oscillating circuit portion of the phase locked loop according to this embodiment, in which a random walk filter 73, a counter 74, a register 75, an adder 76 and an oscillating circuit 77 each correspond to the random walk filter 3, counter 4, register 5, adder 6 and oscillating circuit 7 respectively.

The random walk filter 73 reads the output of the phase/frequency detector 2 at the clock cycle $t_{ck}$ and, if the output of the phase/frequency detector 2 is LAG, then −1 is accumulated into the internal counter, and if it is LEAD, then +1 is accumulated into the same. The random walk filter 3, if the value of the internal counter becomes +N, emits the UP and, if it becomes −N, emits the DOWN. The counter 74 accumulates the UP and DOWN emitted from the random walk filter 73. On the other hand, while LAG is being entered, then the register 75 emits −G, and if LEAD is being entered, it emits +G.

When the phase locked loop of FIG. 8 according to this embodiment and the charge pump phase locked loop of FIG. 7 are compared with each other, it can be seen that the pump current and the capacitor for the charge pump type correspond to the random walk filter 73 and the up-down counter 74 of the digital PLL respectively and that the resistor 67 corresponds to the register 75. From this relationship, it is apparent that the natural frequency $\omega_n$ and the damping factor $\xi$ for the phase locked loop according to this embodiment can be each represented by the following formulae (3) and (4) respectively.

$$\omega_n = \{K_C/(2\pi t_{ck} N)\}^{\frac{1}{2}} \quad (3)$$

$$\xi = (G N t_{ck}/2)\omega_n \quad (4)$$

Figure 1:
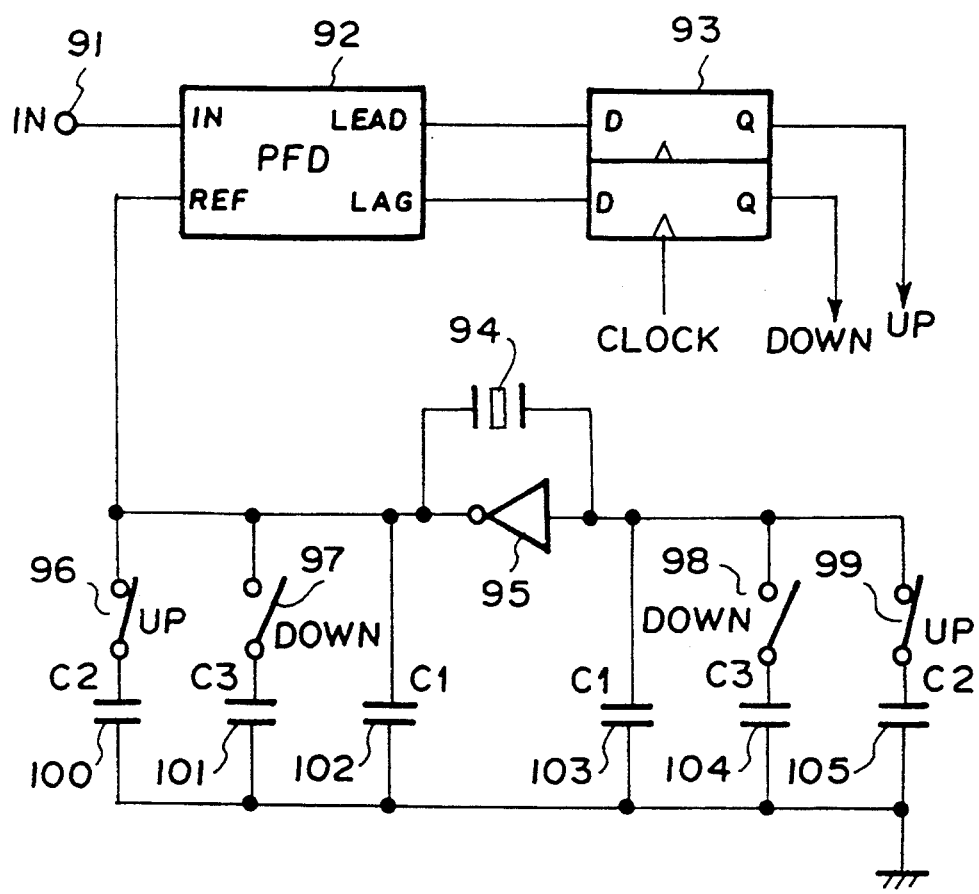
FIG. 1 is a block diagram of the arrangement of a jitter attenuator phase locked loop according to a prior art.

Since the phase locked loop according to this embodiment is the second order loop, the loop characteristic is determined by the natural frequency $\omega_n$ and the damping factor $\xi$. Although, in the conventional phase locked loop of FIG. 1, the bandwidth of the loop is determined by only the gain of the oscillating circuit, in this embodiment, parameters for determining the natural frequency $\omega_n$ and the damping factor $\xi$ comprise four: the gain $K_c$, clock cycle $t_{ck}$, value N set to the random walk filter 73 and the value G set to the register 75, and are great in degree of freedom as compared with the prior art. Therefore, a desired loop bandwidth can be obtained.

Further, since the secondary order phase locked loop causes no steady phase error for the frequency offset, if it is used for the jitter attenuator, then the FIFO stage number can be reduced as compared with the prior art.

Figure 9:
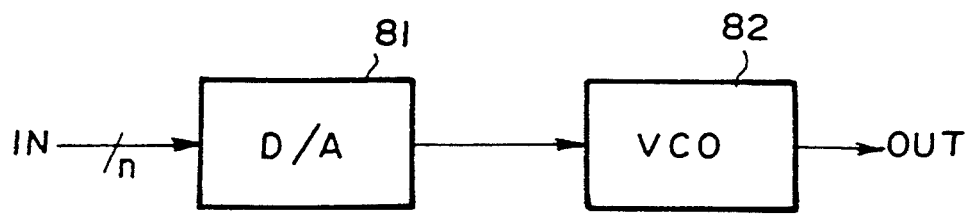
FIG. 9 is a block diagram of another embodiment of the oscillating circuit.

Incidentally, although, in the foregoing embodiment, the quartz oscillating circuit was used as the oscillating circuit, it is not restricted to the same. In the present invention, any oscillating circuit which may control the oscillating frequency by the n-bit digital signal may be applied. For example, as shown in FIG. 9, even if the oscillating circuit comprises a digital analog converter 81 and a voltage control oscillating circuit 82, a similar effect as in the foregoing embodiment using the quartz oscillating circuit can be obtained.

As described above, since the phase locked loop according to the present invention comprises a loop filter including a random walk filter for selectively emitting the up pulse and down pulse according to the output of the phase/frequency detector, a counter for accumulating these pulses, a register for emitting a specific value according to the output signal of the phase/frequency detector and an adder for adding the values emitted from the counter and register, the order number of the loop can be 2 with the result that the degree of freedom for determining the loop constant is increased while no steady phase error is generated relative to the frequency offset.

What is claimed is:

1. A phase locked loop comprising:
    a voltage control oscillating circuit;
    a phase/frequency detector for comparing an input signal input to a first input terminal of said detector and an output signal of said voltage control oscillating circuit input to a second input terminal of said detector to determine a difference in phase and frequency between said input and output signals, and outputting a detector output signal indicative thereof;
    a random walk filter for selectively providing one of an up pulse and down pulse in response to the detector output signal;
    a counter for counting occurrences of said up pulse and down pulse and outputting a count value signal;

a register for providing a value signal in response to said detector output signal; and an adder for adding said count value signal and said value signal and outputting and adder output signal, said voltage control oscillating circuit outputting said output signal having a frequency based on said adder output signal.

2. A phase locked loop as claimed in claim 1, wherein said voltage control oscillating circuit comprises a quartz-crystal resonator.

3. A phase locked loop comprising:

a digitally controlled oscillating circuit having an input and output terminal;

a phase/frequency detector for comparing an input signal supplied to a first input terminal of the detector with an oscillator output signal provided at the output terminal of the oscillating circuit and supplied to a second input terminal of the detector to determine the difference in phase and frequency between the input and output signals;

a random walk filter for selectively generating an up pulse and a down pulse in response to an output signal provided at an output terminal of the detector and supplied to an input terminal of the filter;

a counter for counting occurrences of the up pulse and the down pulse provided at an output terminal of the filter and supplied to an input terminal of the counter to generate a first digital output signal at an output terminal of the counter based on a result of the counting;

a register for generating a second digital output signal at an output terminal of the register in response to the output signal provided at the output terminal of the detector and supplied to an input temrinal of the register;

an adder for adding the first digital output signal supplied to a first input terminal of the adder to the second digital output signal supplied to a second input terminal of the adder to generate a digital output signal at an output terminal of the adder based on a result of the adding;

means for coupling the output terminal of the detector to the input terminal of the filter;

means for coupling the output terminal of the filter to the input terminal of the counter;

means for coupling the output terminal of the detector to the input terminal of the register;

means for coupling the output terminal of the counter to the first input terminal of the adder;

means for coupling the output terminal of the register to the second input terminal of the adder;

means for coupling the output terminal of the adder to the input terminal of the oscillating circuit; and means for coupling the output terminal of oscillating circuit to the second input terminal of the detector;

wherein the digital output signal provided by the adder is supplied to the input terminal of the oscillating circuit, which generates the oscillator output signal having a frequency based on the digital output signal of the adder, the oscillator output signal being supplied to the second input terminal of the detector.

4. A phase locked loop as claimed in claim 3, wherein the oscillating circuit comprises a quartz-crystal resonator.

* * * * *